United States Patent [19]

Nishikawa et al.

[11] Patent Number: 5,305,341
[45] Date of Patent: Apr. 19, 1994

[54] SEMICONDUCTOR LASER WHOSE ACTIVE LAYER HAS AN ORDERED STRUCTURE

[75] Inventors: Yukie Nishikawa, Narashino; Koichi Nitta; Genichi Hatakoshi, both of Yokohama; Masaki Okajima, Kawasaki; Minoru Watanabe; Kazuhiko Itaya, both of Tokyo, all of Japan

[73] Assignee: Kabushiki Kaisha Toshiba, Kawasaki, Japan

[21] Appl. No.: 836,763

[22] Filed: Feb. 19, 1992

[30] Foreign Application Priority Data

Feb. 19, 1991 [JP] Japan .................................. 3-24382
Jul. 15, 1991 [JP] Japan .................................. 3-173756

[51] Int. Cl.$^5$ ................................................ H01S 3/19
[52] U.S. Cl. ......................................... 372/45; 372/46
[58] Field of Search ................................. 372/45, 46

[56] References Cited

U.S. PATENT DOCUMENTS 5,157,679 10/1992 Kondow et al. ..................... 372/45

FOREIGN PATENT DOCUMENTS 0408373 1/1991 European Pat. Off. .
0458408 11/1991 European Pat. Off. .

OTHER PUBLICATIONS

Japanese Journal of Applied Physics, vol. 27, No. 8, pp. 1549-1552, Aug., 1988, T. Suzuki, et al., "P-Type Doping Effects on Band-Gap Energy for $Ga_{0.5}In_{0.5}P$ Grown by Metalorganic Vapor Phase Epitaxy".

Japanese Journal of Applied Physics, vol. 27, No. 11, pp. 2098-2106, Nov., 1988, T. Suzuki, et al., "Band-Gap Energy Anomaly and Sublattice Ordering in GaInP and AlGaInP Grown by Metalorganic Vapor Phase Epitaxy".

Japanese Journal of Applied Physics, Supplements. Extended Abstracts 22th Conference on Solid State Devices and Materials, 1990, pp. 565-568, K. Itaya, et al., "High-Temperature CW Operation of 630 nm Band InGaAlP Visible Light Laser Diodes".

SPIE Proceedings of the Optical Data Storage Topical Meeting, vol. 1078, Jan. 1989, pp. 60-70, D. P. Bour, "Visible Semiconductor Lasers".

Applied Physics Letters, vol. 50, No. 11, Mar. 6, 1987, pp. 673-675, A. Gomyo, et al., "Evidence for The Existence of An Ordered State in $Ga_{0.5}In_{0.6}P$ Grown by Metalorganic Vapor Phase Epitaxy and Its Relation to Band-Gap Energy".

IEEE Journal of Quantum Electronics, vol. QE-23, No. 6, Jun. 1987, pp. 704-711, Kenichi Kobayashi, et al., "AlGaInP Double Heterostructure Visible-Light Laserdiodes with a GaInP Active Layer Grown by Metalorganic Vapor Phase Epitaxy".

Japanese Journal of Applied Physics, vol. 29, No. 9, Sep. 1990, pp. L1669-L1671, Kenichi Kobayashi, et al., "632.7 nm CW Operation (20° C.) of AlGaInP Visible Laser Diodes Fabricated on (001) 6° Degree Off Toward <110> GaAs Substrate".

Primary Examiner—James W. Davie
Attorney, Agent, or Firm—Oblon, Spivak, McClelland, Maier & Neustadt

[57] ABSTRACT

According to this invention, in a semiconductor laser, an n-type InGaAlP cladding layer, an InGaP active layer, and a p-type InGaAlP cladding layer are sequentially grown on an n-type GaAs substrate to form a double hetero structure. The active layer is constituted by an ordered structure having regularity in the <111> directions, and the p-type cladding layer is constituted by a disordered structure. Band discontinuity in conduction band between the active layer and the p-type cladding layer is increased to improve the temperature characteristics of the laser.

19 Claims, 7 Drawing Sheets

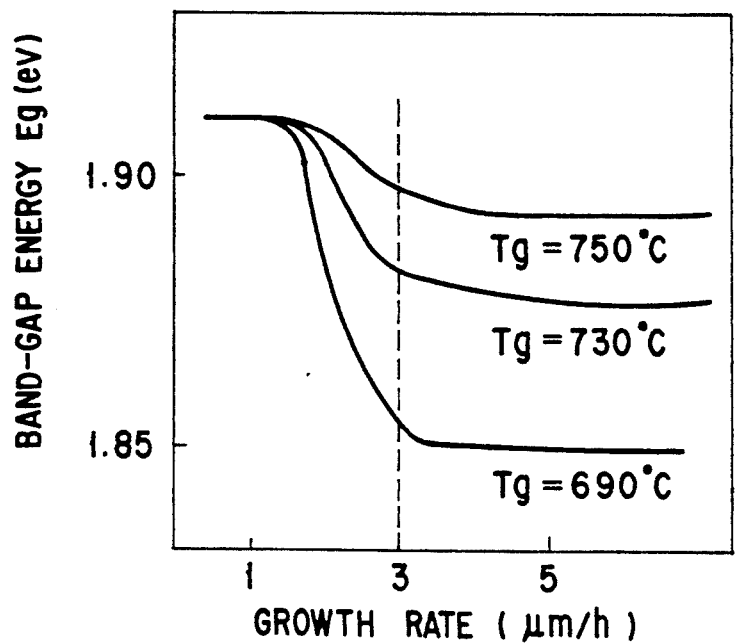
F I G. 6
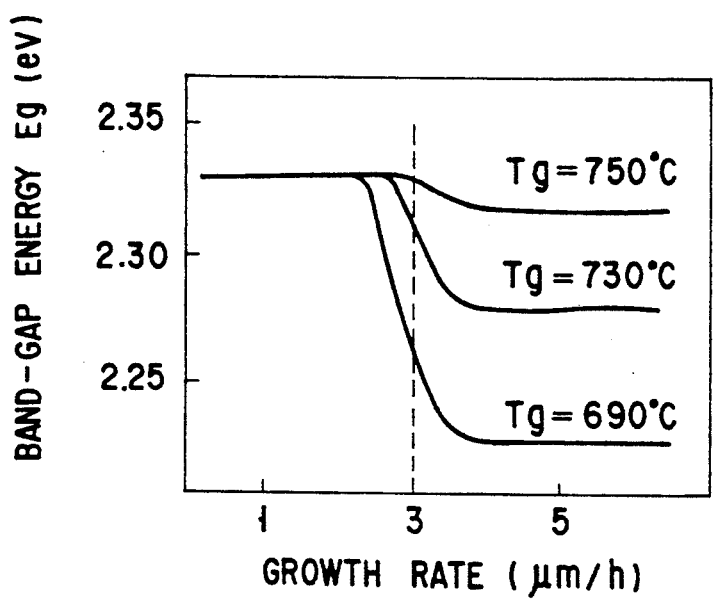
F I G. 7

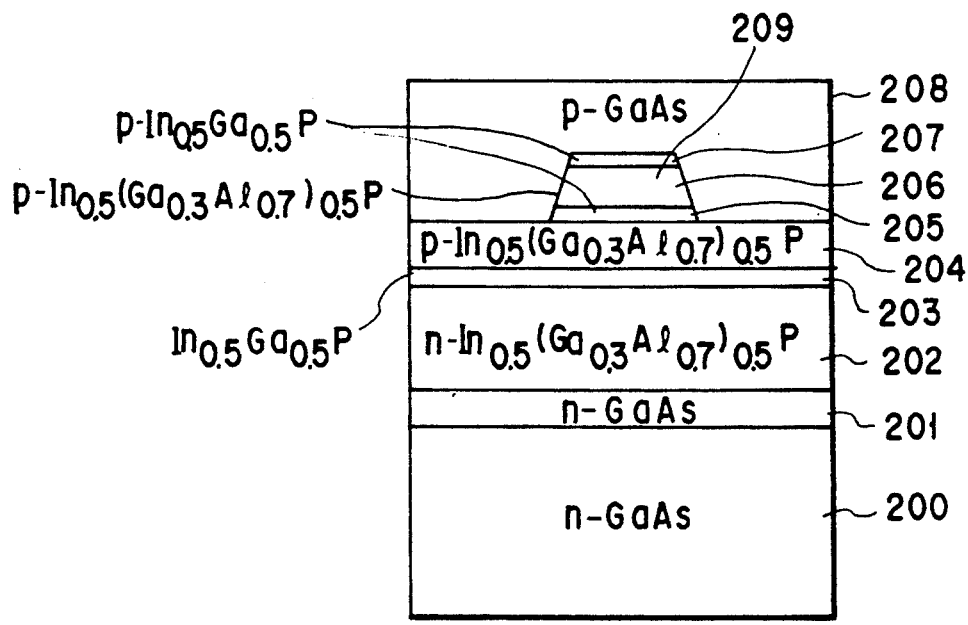
F I G. 9
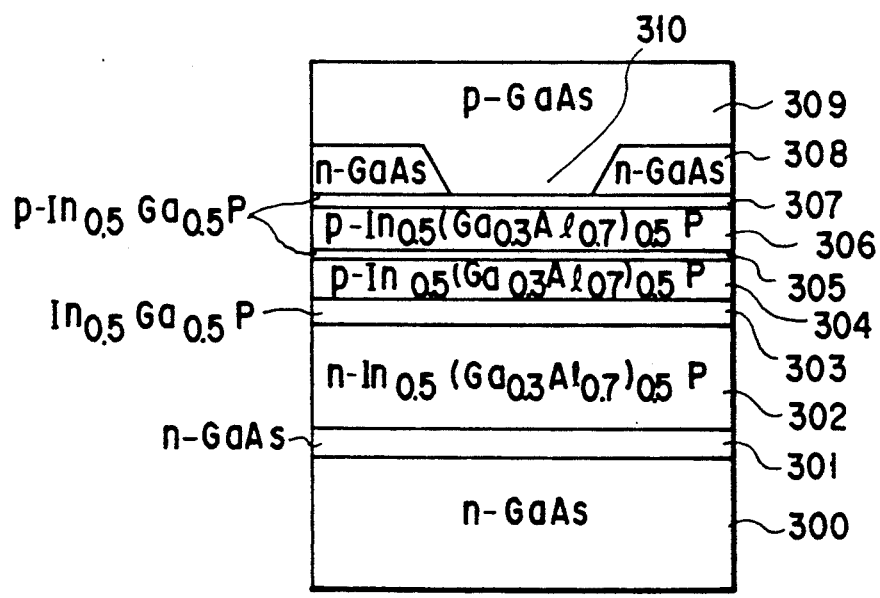
F I G. 10

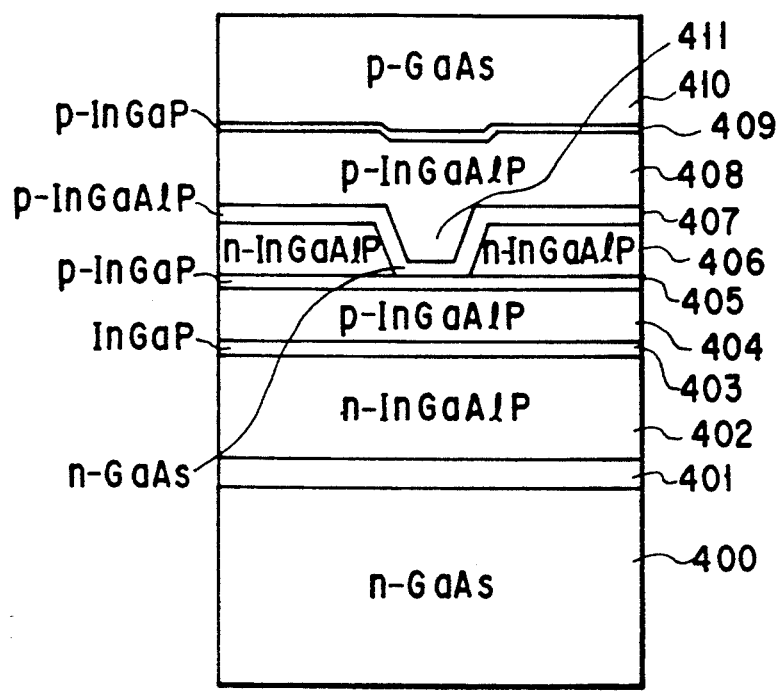
F I G. 11
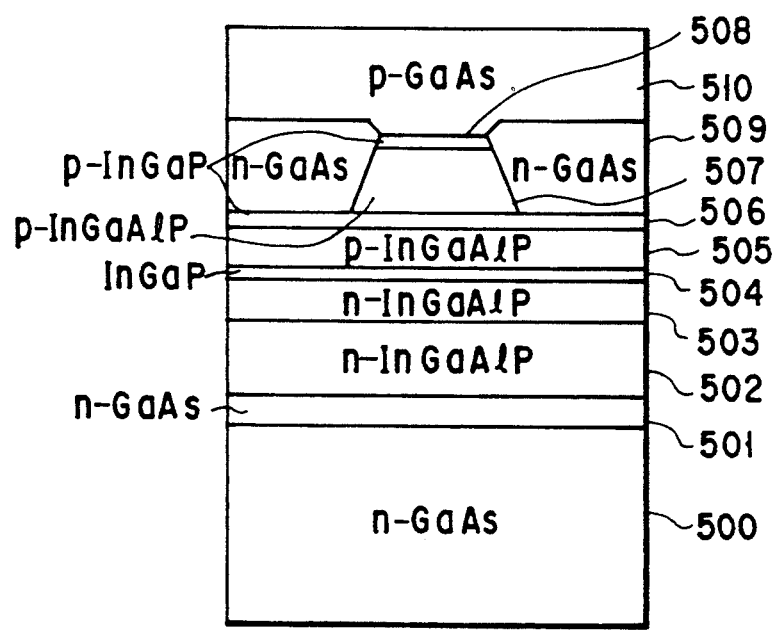
F I G. 12

SEMICONDUCTOR LASER WHOSE ACTIVE LAYER HAS AN ORDERED STRUCTURE

BACKGROUND OF THE INVENTION

Field of the Invention

The present invention relates to a semiconductor laser using Group III-V compound semiconductor materials and, more particularly, to a semiconductor laser using InGaAlP materials in a double hetero structure.

Description of the Related Art

In recent years, an InGaAlP red laser having an oscillation wavelength in a 0.6-μm band has been commercially available, and it has been expected that the red laser will be widely applied as a light source for an optical disk apparatus, a laser beam printer, or the like.

A decrease in oscillation threshold value of a semiconductor laser and an improvement of temperature characteristics are very important in consideration of an increase in service life. The threshold value of laser oscillation and the temperature characteristics depend on enclosure of carriers in an active layer including suppression of leakage of electrons having a small effective mass to a p-type cladding layer.

In a conventional GaAlAs semiconductor laser, band discontinuity between the conduction band of an active layer and that of a p-type cladding layer can be sufficiently increased. Since this discontinuity effectively prevents leakage of electrons from the active layer to the p-type cladding layer, an increase in oscillation threshold value is not a serious problem in the GaAlAs semiconductor laser.

However, the InGaAlP materials have characteristics in which discontinuity of the conduction bands is smaller than that of the conventional GaAlAs materials. Therefore, leakage of electrons to the p-type cladding layer have not been sufficiently prevented by the band discontinuity, and effective enclosure of carriers is not easily obtained in the InGaAlP-based materials.

Conventionally, in a laser using the InGaAlP semiconductor materials, band discontinuity between an active layer and a p-type cladding layer cannot be sufficiently increased, carriers cannot be easily enclosed in the active layer, and the temperature characteristics of the laser cannot be easily improved.

SUMMARY OF THE INVENTION

The present invention has been made in consideration of the above circumstances, and has as its object to provide a semiconductor laser capable of increasing band discontinuity between an active layer and a p-type cladding layer to improve temperature characteristics of the laser.

According to the gist of the present invention, in an InGaAlP visible light semiconductor laser, formation of ordered structures in an active layer and a p-type cladding layer is controlled to increase band discontinuity between the active layer and the p-type cladding layer.

According to the present invention, a semiconductor laser having a double hetero structure obtained by sandwiching an active layer made of an InGaAlP material or the like between p- and n-type cladding layers has the following characteristics. That is, in the double hetero structure, an ordered structure having regularity in the $<111>$ orientation is formed in the active layer and no ordered structure is formed in the p-type cladding layer.

In an InGaAlP materials grown by a metal organic chemical vapor deposition method (MOCVD method) or the like, it is known that an arrangement of Group III atoms have regularity by changing growth conditions such as a growth temperature and a ratio of molar flow rate of group-V to group-III sources (V/III) ratio) (for example, J. Crystal Growth 93 (1988) P. 406). This regularity is generally called an ordered structure or a natural superlattice.

The InGaAlP materials have a zinc blend structure, Group III atoms (In, Ga, Al) are generally arranged at random in group-III sublattices (this is called a disordered structure in contrast to the ordered structure). In this case, the period of a lattice in the $<111>$ orientation, i.e., a lattice constant, depends on the periods of Group III atoms and Group V atoms and has one value a.

In contrast to the single lattice constant of the randomly ordered group III material discussed above, the ordered structure has a structure in which an In rich surface and a Ga (of Al) rich surface are formed in four directions ($<\bar{1}11>$, $<1\bar{1}1>$, $<11\bar{1}>$, $<\bar{1}\bar{1}\bar{1}>$), independent of a substrate orientation The relationship between these four directions are shown in FIG. 2. The $<\bar{1}11>$ direction is perpendicular to $(\bar{1}11)$ surface. This structure is defined as an ordered structure of the $<111>$ direction. The ordered structure is not formed in all crystal grains but is present as a domain. In this case, the period of the lattice constant, depends on the regularity of arrangement of Group III atoms and has two values a and 2a.

When the ordered structure is formed, the band-gap energy (Eg) of a material is changed. When the ordered structure is formed in an InGaAlP material, the Eg is smaller than that of an InGaAlP material in which the ordered structure is not formed.

According to the present invention, on the basis of the above situation, an ordered structure is formed in an active layer, and no ordered structure is formed in a p-type cladding layer, such that band discontinuity between the active layer and the p-type cladding layer is increased. In addition, growth conditions under which the active layer and the p-type cladding layer are grown are changed to control the formation of the ordered structure.

According to an experiment performed by the present inventors, when an InGaAlP material was used as an active layer, the Eg of the active layer was 1.91 eV when no ordered structure was formed in the active layer. Within a range of the growth conditions under which the experiment was performed, in an InGaAlP material in which an ordered structure of the $<111>$ direction was formed, the smallest Eg was 1.85 eV. In addition, when no ordered structure was formed in an $In_{0.5}(Ga_{0.3}Al_{0.7})_{0.5}P$ layer used as a p-type cladding layer, an Eg of the layer was 2.33 eV. The smallest Eg of the layer was 2.33 eV when the $In_{0.5}(Ga_{0.3}Al_{0.7})_{0.5}P$ layer had an ordered structure of the $<111>$ direction.

That is, a difference in band-gap energy Eg between the active layer and the p-type cladding layer, both of which have no ordered structure, is 0.42 eV. In contrast to this, a difference in band-gap energy Eg between the active layer and the p-type cladding layer, both of which have ordered structures of the $<111>$ direction is about 0.38 to 0.40 eV.

In this case, band discontinuity in conduction band effectively functions to prevent leakage of electrons from the active layer to the p-type cladding layer, i.e., to enclose carriers. In this specification, however, the difference in band-gap energy Eg between the active layer and the p-type cladding layer is used as an evaluation standard of the band discontinuity for convenience. When an InGaP layer having an ordered structure of the <111> direction and an Eg of 1.85 eV is used as an active layer, and an $In_{0.5}(Ga_{0.3}Al_{0.7})_{0.5}P$ (Eg=2.33 eV) layer having no ordered structure of the <111> direction is used s p-type cladding layer, an Eg difference between these layers is increased to, i.e., 0.48 eV. This value is larger by 60 meV than that between the active layer and the p-type cladding layer both of which have no ordered structure. This difference is very effective to enclose electrons in the active layer and largely influences the improvement of temperature characteristics of a semiconductor laser. In fact, it was confirmed by an experiment that a maximum continuous oscillation temperature was increased by 40° C. or more.

According to the present invention, since the band discontinuity between the active layer and the p-type cladding layer can be increased, and carriers can be effectively enclosed in the active layer, a reduction of the threshold value of a laser and an improvement of temperature characteristics can be expected.

As described above, according to the present invention, an ordered structure of the <111> direction is formed in the active layer, and no ordered structure is formed in the p-type cladding layer, such that band discontinuity between the p-type cladding layer and the active layer can be increased. Therefore, overflow of electrons can be effectively suppressed, and a semiconductor laser having preferable temperature characteristics can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a graph showing a relationship between a growth rate and a band-gap energy in an active layer;

FIG. 7 is a graph showing a relationship between a growth rate and a band-gap energy in a p-type cladding layer;

FIG. 9 is a sectional view showing a schematic structure of a semiconductor laser according to the third embodiment of the present invention;

FIG. 10 is a sectional view showing a schematic structure of a semiconductor laser according to the fourth of the present invention;

FIG. 11 is a sectional view showing a schematic structure of a semiconductor laser according to the fifth embodiment of the present invention; and FIG. 12 is a sectional view showing a schematic structure of a semiconductor laser according to the sixth embodiment of the present invention.

DETAILED DESCRIPTION OF THE PREFERRED EMBODIMENTS

The present invention will be described below with reference to the accompanying drawings.

Figure 1:
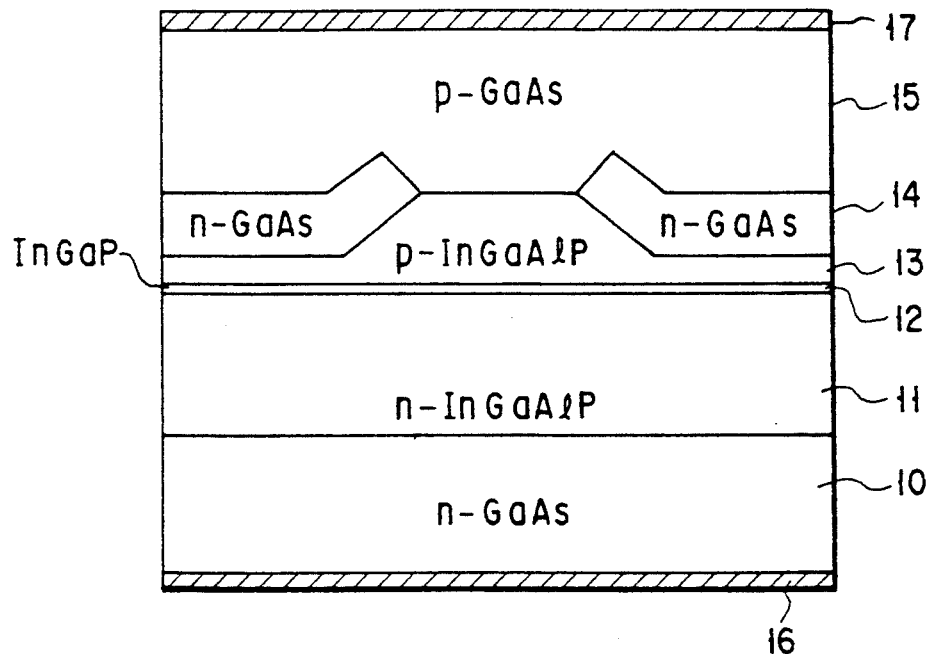
FIG. 1 is a sectional view showing an arrangement of a semiconductor laser according to the first embodiment of the invention.

FIG. 1 is a sectional view showing a schematic structure of an InGaAlP semiconductor laser according to the first embodiment of the present invention. Referring to FIG. 1, reference numeral 10 denotes an n-type GaAs substrate. On the substrate 10, an n-type $In_{0.5}(Ga_{0.3}Al_{0.7})_{0.5}P$ cladding layer 11 (carrier concentration: $4\times10^{17}$ cm$^{-3}$; thickness: 1.2 $\mu$m), an $In_{0.5}Ga_{0.5}P$ active layer 12 (undoped; thickness: 0.02 $\mu$m), and a p-type $In_{0.5}(Ga_{0.3}Al_{0.7})_{0.5}P$ cladding layer 13 (carrier concentration: $8\times10^{17}$ cm$^{-3}$; thickness: 1.2 $\mu$m) are sequentially formed.

Figure 2:
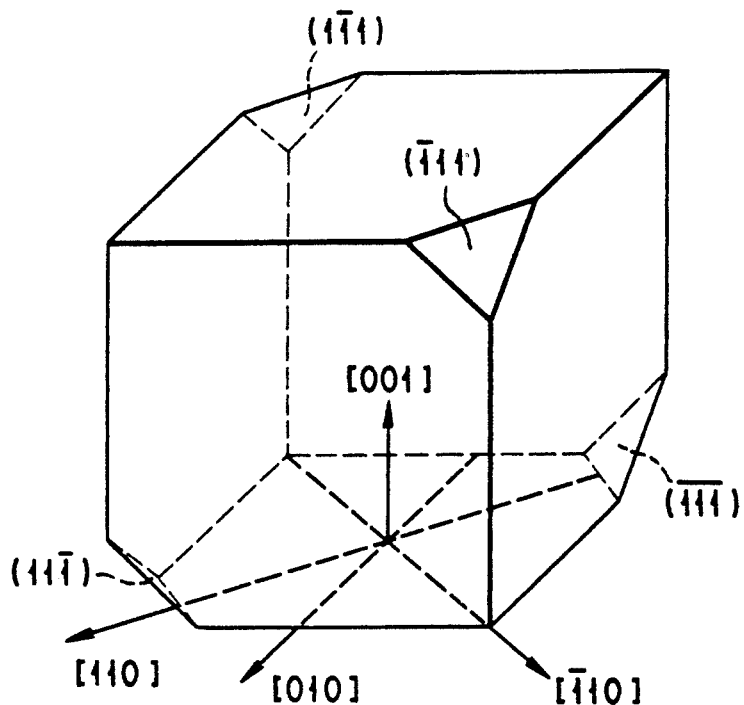
FIG. 2 is an enlarged view showing an arrangement of the main part of the embodiment in FIG. 1

In this case, the substrate 10 has the (100) plane as shown in FIG. 2, an ordered structure of the <111> direction is formed in the active layer 12, and no ordered structure is formed in the p-type cladding layer 13. The substrate 10 does not necessarily have the (100) plane, and the substrate 10 may have a plane which is slightly inclined from the (100) plane by, e.g., 5°.

The p-type cladding layer 13 is etched halfway to form a stripe-like ridge portion. This ridge portion has a bottom width of 5 $\mu$m, and the distance between the bottom of the ridge portion and the active layer 12 is 0.3 $\mu$m.

N-type GaAs current blocking layers 14 (carrier concentration $2\times10^{18}$ cm$^{-3}$; thickness: 1 $\mu$m) are grown and formed on side surfaces of the ridge portion, and a p-type GaAs contact layer 15 (carrier concentration: $2\times10^{18}$ cm$^{-3}$; thickness: 3 $\mu$m) is formed on the upper surfaces of the ridge portion and the current blocking layers 14. An n-side electrode 16 is formed on the lower surface of the substrate 10, and a p-side electrode 17 is formed on the contact layer 15.

The structure shown in FIG. 1 is grown by a low-pressure MOCVD method. According to an experiment performed by the present inventors, the following relationship was found between a band-gap energy and growth conditions under which the active layer 12 and the p-type cladding layer 13 were grown.

Figure 3:
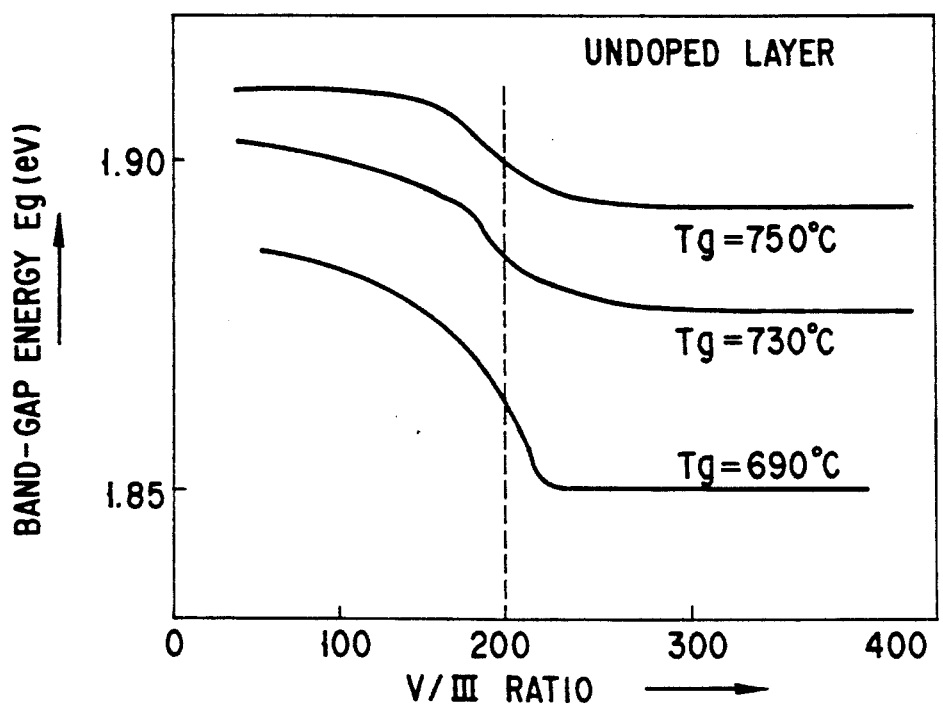
FIG. 3 is a graph showing a relationship between a V/III ratio and a band-gap energy in an active layer.

FIG. 3 shows a relationship between a V/III ratio (a ratio of molar flow rate of PH3 to group-III sources when the active layer 12 is grown) and a band-gap energy Eg of the active layer 12. Growth temperatures (Tg) were set at 690° C., 730° C., and 750° C. Even when any growth temperature (Tg) is set, when the V/III ratio is 200 or more, the band-gap energy Eg is sharply decreased. This is because an ordered structure of the <111> direction is easily formed when the V/III ratio is 200 or more. In addition, the Eg is increased in accordance with an increase in growth temperature because an ordered structure is not easily formed at a high growth temperature.

Although no ordered structure was formed in an InGaP layer having an Eg of 1.91 eV or more, ordered structures were formed in other InGaP layers. In an InGaP layer which was grown at a Tg of 690° C. and a V/III ratio of 200 or more, an ordered structure was formed most strongly. At this time, an Eg of 1.85 eV was obtained.

Figure 4:
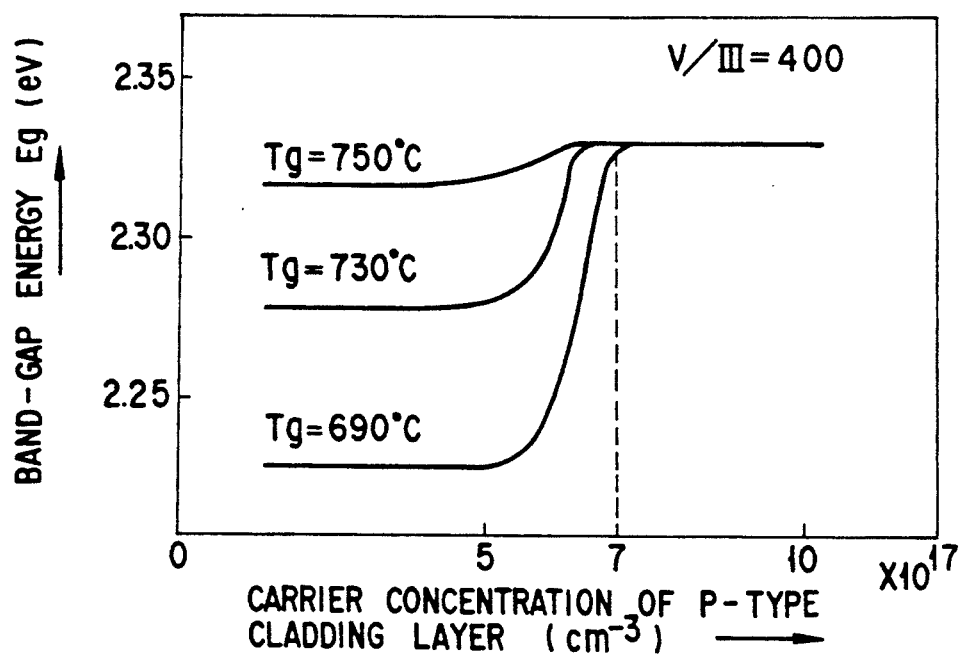
FIG. 4 is a graph showing a relationship between a carrier concentration and a band-gap energy in a p-type cladding layer.

FIG. 4 shows a relationship between a carrier concentration and a band-gap energy Eg of the p-type cladding layer 13. At any growth temperature Tg, the Eg was increased in accordance with an increase in carrier concentration, and the Eg had a constant value, i.e., 2.33 eV, when the carrier concentration was $7 \times 10^{17}$ cm$^{-3}$ or more. Although no ordered structure was formed in a sample having an Eg of 2.33 eV, an ordered structure could be detected in other samples. This is because a p-type dopant has an effect to prevent the formation of an ordered structure in accordance with an increase in carrier concentration.

According to the above fact, growth conditions under which the laser according to this embodiment shown in FIG. 1 was grown was defined as follows. That is, a growth temperature was set at 690° C., a V/III ratio was set to be 400, and a doping concentration of the p-type cladding layer 13 was set to be $8 \times 10^{17}$ cm$^{-3}$. At this time, the band-gap energies of the active layer 12 and the p-type cladding layer 13 were 1.85 eV and 2.33 eV, respectively. Although an ordered structure of the <111> direction was formed in the active layer 12, no ordered structure was formed in the p-type cladding layer 13, such that an Eg difference between these layers was 0.48 eV. When a stripe width and a resonator oscillation threshold value was 35 mA, and a maximum continuous oscillation temperature was 80° C. In addition, in a life test at a temperature of 50° C., the laser was not conspicuously degraded, and it was confirmed that the laser was operated for 2,000 hours.

In contrast to this, when an active layer and a p-type cladding layer were grown under growth conditions such that ordered structures of the <111> direction were not formed in either of these layers, the band-gap energies of the layers were 1.91 eV and 2.33 eV, respectively, and the Eg difference was 0.42. At this time, a growth temperature was set at 750° C., a V/III ratio was set to be 100, and the carrier concentration of the p-type cladding layer was set to be $4 \times 10^{17}$ cm$^{-3}$. In a laser having a stripe width of 5 μm and a resonator length of 400 μm, a maximum continuous oscillation temperature was as low as 40° C., and life performance was not good. On the other hand, when an ordered structure of the <111> direction was formed in each of the active layer and the p-type cladding layer, band continuity was measured to be 0.38 to 0.40 eV. The maximum continuous oscillation temperature of a laser grown under the above growth conditions was as low as 30° C.

According to this embodiment, since an ordered structure of the <111> direction is formed in the active layer 12, and no ordered structure of the <111> direction is formed in the p-type cladding layer 13, band discontinuity between the active layer 12 and the p-type cladding layer 13 can be increased. For this reason, overflow of electrons can be effectively suppressed, and an InGaAlP semiconductor laser having preferable temperature characteristics can be obtained. Therefore, the industrial effect of the semiconductor laser is extremely large.

Figure 5:
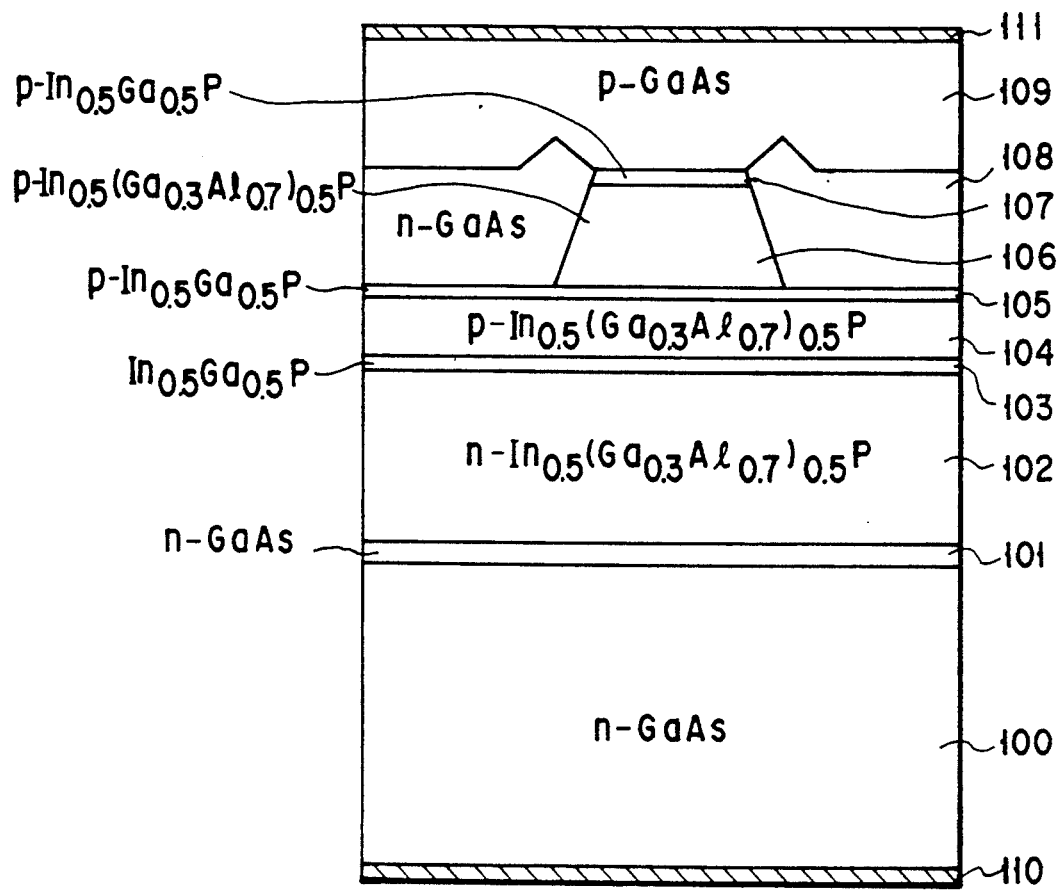
FIG. 5 is a sectional view showing a schematic structure of a semiconductor laser according to the second embodiment of the present invention.

FIG. 5 is a sectional view showing a schematic structure of a semiconductor laser according to the second embodiment of the present invention. Referring to FIG. 5, reference numeral 100 denotes an n-type GaAs substrate; 101, an n-type GaAs buffer layer; 102, an n-type $In_{0.5}(Ga_{0.3}Al_{0.7})_{0.5}P$ cladding layer; 103, an $In_{0.5}Ga_{0.5}P$ active layer; 104, a p-type $In_{0.5}(Ga_{0.3}Al_{0.7})_{0.5}P$ first cladding layer; 105, a p-type $In_{0.5}Ga_{0.5}P$ etching stop layer; 106, a p-type $In_{0.5}(Ga_{0.3}Al_{0.7})_{0.5}P$ second cladding layer; 107, a p-type $In_{0.5}Ga_{0.5}P$ cap layer; 108, an n-type GaAs current blocking layer; 109, a p-type GaAs contact layer; 110, an n-type electrode; and 111, a p-type electrode. in the active layer 103, and no ordered structure of the <111> direction is formed in the first p-type cladding layer 104. The structure shown in FIG. 5 is grown by a low pressure MOCVD method, and formation of the ordered structure of the <111> direction is controlled by changing conditions for growing the active layer 103 and the first p-type cladding layer 104.

FIG. 6 shows a relationship between a growth rate and a band-gap energy (Eg) in growing the active layer. Growth temperatures (Tg) were set at 690° C., 730° C., and 750° C., respectively. At any growth temperature, the Eg was sharply decreased when the growth rate becomes 3 μm/h or more, because an ordered structure of the <111> direction was easily formed when the growth rate becomes 3 μm/h or more. In addition, the Eg was increased in accordance with an increase in growth temperature because an ordered structure was not easily formed at a high growth temperature (Tg). In an InGaP layer having an Eg of 1.91 eV, no ordered structure was formed. In an InGaP layer which was grown at a growth temperature of 690° C. and a growth rate of 3 μm/h or more, an ordered structure was formed most strongly. At this time, an Eg of 1.85 eV was obtained.

FIG. 7 shows a relationship between a band-gap energy (Eg) and a growth rate in the p-type cladding layer. At any growth temperature, the Eg was increased in accordance with a decrease in growth rate, and the Eg had a constant value, i.e., 2.33 eV, at a growth rate of 1 μm/h or less. In a sample having an Eg of 2.33 eV, no ordered structure was formed. In other samples, an ordered structure was detected.

Figure 8:
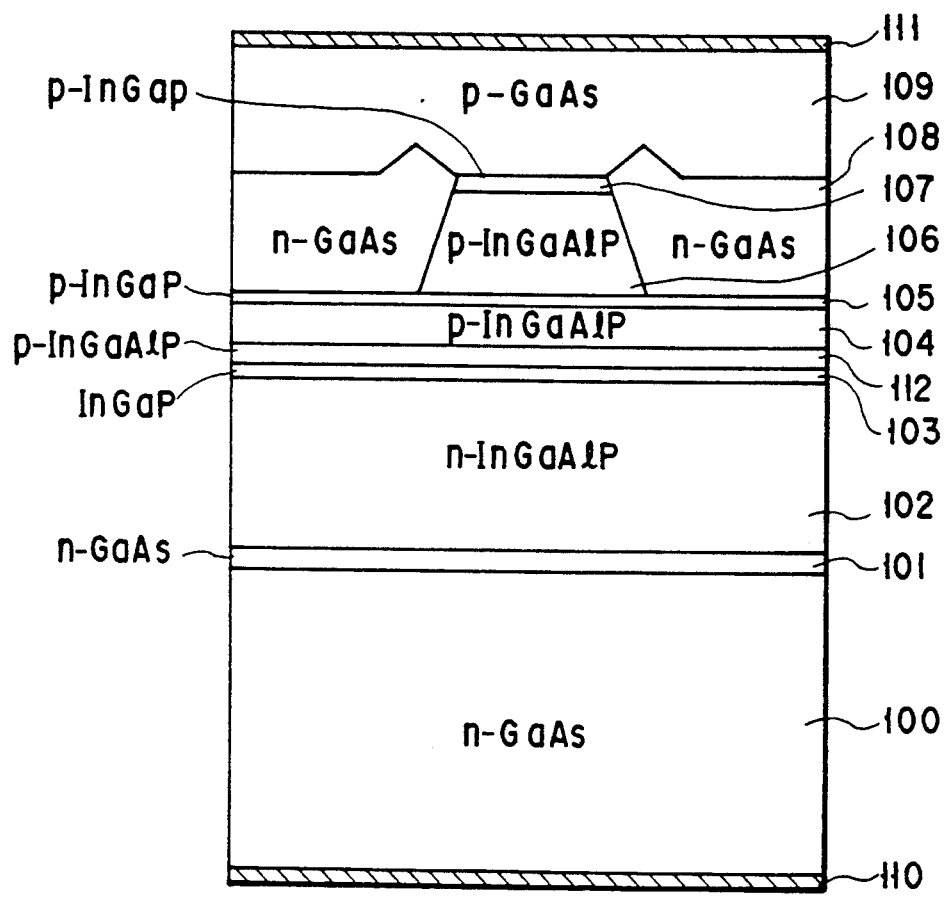
FIG. 8 is a sectional view showing a schematic structure of a modification of the second embodiment.

When a growth rate was decreased, and the p-type cladding layer was grown thick, a p-type dopant was diffused in the active layer to degrade laser characteristics. However, when the p-type cladding layer having a low growth rate was grown to have a thickness of 0.5 μm to 0.8 μm, this problem could be solved. In addition, when the p-type cladding layer having a low growth rate was located at a position apart from the active layer by 0 to 40 nm, it was found that leakage of electrons from the active layer to the p-type cladding layer could be prevented so that an increase in operating current could be suppressed. For this reason, as shown in FIG. 8, a p-type cladding layer 112 having an ordered structure may be formed to have a thickness of 40 nm or less, and the p-type cladding layer 104 having no ordered structure may be formed thereon When Zn, Mg, Cd, Be, or the like was used as the p-type dopant, the above effect could be obtained The band-gap energies of the active layer 103 and the first p-type cladding layer 104 which were grown under the above growth conditions were 1.85 eV and 2.33 eV, respectively. An ordered structure of the <111> direction was formed in the active layer 103, and no ordered structure was formed in the first cladding layer 104, and an Eg difference between these layers was 0.48 eV. In an InGaAlP semiconductor laser having the above structure in which the active layer 103 having a thickness of 0.3 μm, the first cladding layer 104 having a thickness of 0.3 μm, the second p-type cladding layer 106 having a ridge width of 5 μm, and a resonator length of 400 μm were used, an oscillation threshold value was 35 mA. At this time, a high light output of 40 mW was obtained at a temperature up to 80° C. In addition, in a life test performed at a temperature of 50° C. and a light output of 30 mW, conspicuous degradation could not be detected in this semiconductor laser, and it was confirmed that the semiconductor laser was operated for 2,000 hours or more.

For example, in a conventional method, when an active layer and a p-type cladding layer were grown under growth conditions that ordered structures of the <111> direction were not formed in either of the layers, the band-gap energies of the layers were 1.91 eV and 2.33 eV, respectively, and an Eg difference of the layers was 0.42 eV. In a laser having this structure, a maximum continuous oscillation temperature was as low as 40° C., and the life performance was no good. On the other hand, when ordered structures of the <111> direction were formed in both the active layer and the p-type cladding layer, an Eg difference was 0.38 to 0.40 eV. In a laser grown under the above growth conditions, a maximum continuous oscillation temperature was as low as 30° C.

In this embodiment, although no ordered structure was formed in the first p-type cladding layer 104, an ordered structure of the <111> direction was formed in the second p-type cladding layer 106. In this case, the band-gap energy of the second p-type cladding layer 106 slightly depends on the oscillation threshold value of the laser. For this reason, even when the ordered structure is formed in the second p-type cladding layer 106, no problem occurs. Therefore, the second p-type cladding layer 106 was grown under growth conditions that the growth rate of the layer was increased, thereby suppressing diffusion of a p-type dopant in the active layer 103.

In this embodiment, materials used for the parts are not limited to the above materials. The same effect as described above can be obtained even when the following structure is used. For example, the buffer layer 101 is made of n-type InGaP, the etching stop layer 105 is made of n-type InGaAlP, p-type GaAlAs, or p-type GaAs, the cap layer 107 is made of p-type InGaAlP, p-type GaAlAs, or p-type GaAs, the current blocking layer 108 is made of semi-insulating GaAs or n-type or semi-insulating GaAlAs, the thickness of the first p-type cladding layer 104 is 0.1 μm to 0.4 μm, and the thickness of the active layer 103 is 0.015 μm to 0.03 μm.

When the composition of the cladding layer is expressed as $In_{1-Y}(Ga_{1-X}Al_X)_YP$ wherein an Al composition ratio X and a composition ratio Y are given as $X=0.7$ and $Y=0.5$ in the n- and p-type cladding layers. However, this Al composition ratio is properly determined within a range in which the band-gap energy of each of the n- and p-type cladding layers are larger than that of the active layer 103. In addition, in the active layer 103, although an Al composition ratio X and a composition ratio Y are set to be 0 and 0.5, respectively, the Al composition ratio X and the composition ratio Y may be properly determined within a range in which the band-gap energy of the active layer 103 is smaller than that of the cladding layer.

FIGS. 9 to 12 are sectional views showing schematic arrangements of semiconductor lasers according to the third to sixth embodiments of the present invention.

In the third embodiment shown in FIG. 9, reference numeral 200 denotes an n-type GaAs substrate; 201, an n-type GaAs buffer layer; 202, an n-type InGaAlP cladding layer; 203, an InGaP active layer in which an ordered structure of the <111> direction is formed; 204, a p-type InGaAlP first cladding layer in which no ordered structure is formed; 205, a p-type InGaP etching stop layer; 206, a p-type InGaAlP second cladding layer; 207, a p-type InGaP intermediate band-gap layer; and 208, a p type contact layer.

When a current is injected into the laser arranged as described above, the injected current is squeezed into a ridge portion 209 formed by a p-p hetero barrier between the contact layer 208 and the p-type cladding layer 204. Although a light beam is generated in the active layer 203 substantially along the ridge portion 209 to cause laser oscillation, the beam is enclosed due to an effective refractive index difference between the ridge portion 209 and the outside of the ridge portion 209. In the above structure, the same effect as described in the first embodiment can be obtained.

Even if the arrangement in FIG. 9 is changed such that the buffer layer 201 is made of n-type InGaP, the active layer 203 is made of n-type InGaAlP, the etching stop layer 205 is made of p-type GaAlAs, and the intermediate band-gap layer 207 is made of p-type GaAlAs or p-type GaAs, the same effect as described above can be obtained. In the cladding layers 202, 204, and 206 of this embodiment, when the composition is expressed as $In_{1-Y}(Ga_{1-X}Al_X)_YP$, an Al composition ratio X is set to be 0.7. However, this Al composition ratio may be properly determined within a range in which the band-gap energy of each of the cladding layers 202, 204, and 206 is sufficiently larger than that of the active layer 203. In addition, in the active layer 203, although $X=0$ and $Y=0.5$, the composition ratios X and Y may be properly determined within a range in which the band-gap energy of the active layer 203 is smaller than that of each of the cladding layers.

In the fourth embodiment shown in FIG. 10, reference numeral 300 denotes an n-type GaAs substrate; 301, an n-type GaAs or n-type InGaP buffer layer; 302, an n type InGaAlP cladding layer; 303, an InGaP or InGaAlP active layer in which an ordered structure is formed; 304, a p-type InGaAlP first cladding layer in which no ordered structure is formed; 305, a p-type InGaP buffer layer; 306, a p-type InGaAlP second cladding layer; 307, a p-type InGaP or p-type AlGaAs intermediate band-gap layer; 308, an n-type semi-insulating GaAs or n-type GaAlAs current blocking layer; and 309, a p-type GaAs contact layer.

When a current is injected into this laser arranged as described above, the injected current is squeezed by a stripe center portion 310 due to a p-n inversion layer formed by the current blocking layer 308. A light beam is generated in the active layer 303 substantially along this stripe portion to cause laser oscillation. In this structure, the same effect as described in the first embodiment can be obtained.

In the cladding layers 302, 304, and 306 of this embodiment, when the composition is expressed as $In_{1-Y}(Ga_{1-X}Al_X)_YP$, an Al composition ratio X is set to be 0.7. However, this Al composition ratio may be properly determined within a range in which the band-gap energy of each of the cladding layers 302, 304, and 306 is sufficiently larger than that of the active layer. In addition, in the active layer 303, an Al composition ratio X and a composition ratio Y may be properly determined within a range in which the band-gap energy of the active layer 303 is smaller than that of each of the cladding layers.

In the fifth embodiment shown in FIG. 11, reference numeral 400 denotes an n-type GaAs substrate; 401, an n-type GaAs or n-type InGaP buffer layer; 402, an n-type InGaAlP cladding layer; 403, an InGaP or InGaAlP active layer in which an ordered structure is formed; 404, a p-type InGaAlP first cladding layer in which no ordered structure is formed; 405, a p-type InGaP or p-type GaAlAs etching stop layer; 406, an n-type semi-insulating InGaAlP or n-type AlGaAs current blocking layer; 407, a p-type InGaAlP or p-type GaAlAs light guide layer; 408, a p-type InGaAlP second cladding layer; 409, a p-type InGaP or p-type GaAlAs intermediate band-gap layer; and 410, a p-type GaAs contact layer.

When a current is injected into a laser arranged as described above, the injected current is squeezed by a stripe center portion 411 due to a p-n inversion layer formed by the current blocking layer 406. Although a light beam is generated in the active layer 403 substantially along this stripe portion 411 to cause laser oscillation, the beam leaking to the current blocking layer 406 is enclosed due to refractive index difference between the light guide layer 407 and the current blocking layer 406. In this structure, the same effect as described in the first embodiment can be obtained.

In the cladding layers 402, 404, and 408 of this embodiment, when the composition is expressed as $In_{1-Y}(Ga_{1-X}Al_X)_YP$, an Al composition ratio X is set to be 0.7. However, this Al composition ratio may be properly determined within a range in which the band-gap energy of each of the cladding layers 402, 404, and 408 is sufficiently larger than that of the active layer 403. In addition, the Al composition ratio of the light guide layer 407 is not limited to X=0.5, and it may be set to be smaller than that of the cladding layer and larger than that of the active layer 403. The Al composition ratio of the current block layer 406 is not limited to X=0.7, and it can be properly changed within a range in which an Al composition ratio X larger than that of the active layer 403 can be obtained. Furthermore, the Al composition ratio X and a composition ratio Y of the active layer 403 may be properly determined within a range in which the band-gap energy of the active layer 403 is smaller than that of each of the cladding layers and the light guide layer.

In the sixth embodiment shown in FIG. 12, reference numeral 500 denotes an n-type GaAs substrate; 501, an n-type GaAs or n-type InGaP buffer layer; 502, an n-type InGaAlP first cladding layer; 503, an n-type InGaAlP second cladding layer; 504, an InGap or InGaAlP active layer in which an ordered structure is formed; 505, a p-type InGaAlP third cladding layer in which no ordered structure is formed; 506, a p-type InGaAlP or p-type GaAlAs etching stop layer; 507, an n-type InGaAlP fourth cladding layer; 508, a p-type InGaP or p-type GaAlAs intermediate band-gap layer; and 509, an n-type GaAs or n-type. GaAlAs current blocking layer; and 510, a p-type GaAs contact layer.

In the laser arranged as described above, when the band-gap energy of the second cladding layer 50 is set to be larger than that of the active layer 504 and smaller than that of the first cladding layer 502, the light density of in the active layer 504 can be reduced. In this structure, the same effect as described above can be obtained.

When the composition is expressed as $In_{1-Y}(Ga_{1-X}Al_X)_YP$, in each of the first, third, and fourth cladding layers, an Al composition ratio X and a composition ratio Y are set to be 0.7 and 0.5, respectively. However, the Al composition ratio X and the composition ration Y may be properly determined within a range in which the band-gap energy of each of the first, third, and fourth cladding layers is sufficiently larger than that of the active layer 504 and larger than that of the second cladding layer 503. In addition, the Al composition ratio of the second cladding layer 503 is not limited to X=0.6, and it may be set to be smaller than that of each of the first, third, and fourth cladding layers and larger than that of the active layer 504. The Al composition ratio X and the composition ratio Y of the active layer 504 may be properly determined within a range in which the band-gap energy of the active layer 504 is smaller than that of each of the cladding layers.

The present invention is not limited to the above-mentioned embodiments. In the embodiments, although InGaAlP is used as material for forming a double hetero structure, any semiconductor material in which an ordered structure or a natural superlattice is formed can be used. As a material having a band-gap energy which is changed by the presence/absence of an ordered structure, InGaAsP is known. Therefore, the present invention can be applied to InGaAsP (including InGaAs and GaAsP). In addition, in the embodiments, Zn is used as a p-type dopant. However, when other dopants such as Mg and Cd may be used to obtain the same effect as described in the embodiments.

In the embodiments, although the structures shown in FIGS. 1, 5, 9 to 12 are described as lateral mode control structures, the present invention can also be applied to another lateral mode control structure, a wide-stripe structure, a gain waveguide structure, or the like. In addition, the material of the substrate is not limited to GaAs, and a material having a lattice constant which is relatively close to the lattice constant of GaAs can be used. When the active layer has lattice mismatching which is equal to or less than 1.5%, the lattice mismatching poses no problem. A stripe of the <01-1> direction or a stripe of the <011> orientation on the (100) substrate may be used as the ridge stripe. When an OFF angle from the (100) plane is set within a range of 15°, a substrate having a plane which is offset from the (100) plane to the <011> direction or a substrate having a plane which is offset from the (100) plane to the <01$\bar{1}$> direction may be used as a substrate. In this case, <011> direction and <01$\bar{1}$> direction cross at right angle on the same plane.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

We claim:

1. A semiconductor laser comprising:

an active layer made of a Group III-V compound semiconductor forming a zinc blend structure, said semiconductor of said active layer being constituted by an ordered structure of Group III atoms along a <111> direction, and said semiconductor having two lattice constants "a" and "2a";

a first cladding layer of an n-conductivity type arranged on a negative polarity side of said active layer, said first cladding layer being constituted by a Group III-V compound semiconductor which forms a zinc blend structure and is heterogeneous from that of said active layer; and a second cladding layer of a p-conductivity type arranged on a positive polarity side of said active layer, said second cladding layer being constituted by a Group III-V compound semiconductor which forms a zinc blend structure and is heterogeneous with that of said active layer, said semiconductor of said second cladding layer having Group III atoms arranged to form a disordered structure in which the Group III atoms are randomly distributed and having the lattice constant "a", whereby the band discontinuity at the interface of the active layer and the second cladding layer is larger than if the Group III atoms of the active layer were disordered and whereby leakage of electrons from said active layer to said second cladding layer is reduced.

2. A laser according to claim 1, wherein a distance between said active layer and said second cladding layer is set to be 0 to 40 nm.

3. A laser according to claim 2, further comprising another cladding layer homogeneous to said second cladding layer and arranged between said active layer and said second cladding layer, said another cladding layer being made of a semiconductor constituted by an ordered structure having regularity of an arrangement of Group III atoms along a <111> direction, and said semiconductor having lattice constants substantially represented by the values a and 2a in the same direction.

4. A laser according to claim 3, wherein each of said active layer, and said first, second, and another cladding layers essentially consists of a semiconductor represented by $In_{1-Y}(Ga_{1-X}Al_X)_YP$ ($0 \leq X \leq 1$, $0 \leq Y \leq 1$).

5. A laser according to claim 1, wherein said first and second cladding layers are formed by an MOCVD method using first and second materials containing the Group V and III elements, respectively, under such conditions that a molar ratio of the flow rate of the first material to that of the second material is not less than 200, and a carrier concentration of said second cladding layer is set to be not less than $7 \times 10^{17}$ cm$^{-3}$.

6. A laser according to claim 3, wherein said first, second, and another cladding layers are formed by an MOCVD method using first and second materials containing the Group V and III elements, respectively, under such conditions that a molar ratio of the flow rate of the first material to that of the second material is not less than 200, and a carrier concentration of said second cladding layer is set to be not less than $7 \times 10^{17}$ cm$^{-3}$.

7. A laser according to claim 1, wherein a thickness of said second cladding layer is set to be 0.05 to 0.8 μm.

8. A semiconductor laser comprising:

an active layer made of a Group III-V compound semiconductor for forming a zinc blend structure, said semiconductor of said active layer being constituted by an ordered structure of Group III atoms along a <111> direction, and said semiconductor having two lattice constants "a" and "2a";

a first cladding layer of an n-conductivity type arranged on a negative polarity side of said active layer, said first cladding layer being constituted by a Group III-V compound semiconductor which forms a zinc blend structure and is heterogeneous from that of said active layer; and a second cladding layer of a p-conductivity type arranged on a positive polarity side of said active layer, said second cladding layer being constituted by a Group III-V compound semiconductor which forms a zinc blend structure and is heterogeneous with that of said active layer, said semiconductor of said second cladding layer having Group III atoms arranged at random, and having the lattice constant "a", wherein each of said active layer and said first and second cladding layers essentially consists of a semiconductor represented in $In_{1-Y}(Ga_{1-X}Al_X)_YP$ ($0 \leq X \leq 1$, $0 \leq Y \leq 1$), whereby the band discontinuity at the interface of the active layer and the second cladding layer is larger than if the Group III atoms of the active layer were disordered and whereby leakage of electrons from said active layer to said second cladding layer is reduced.

9. A laser according to claim 8, wherein a distance between said active layer and said second cladding layer is set to be 0 to 40 nm.

10. A laser according to claim 8, wherein said first and second cladding layers are formed by an MOCVD method using first and second materials containing the Group V and III elements, respectively, under such conditions that a ratio of molar flow rate of the first material to the second material is not less than 200, and a carrier concentration of said second cladding layer is set to be not less than $7 \times 10^{17}$ cm$^{-3}$.

11. A laser according to claim 8, wherein a thickness of said second cladding layer is set to be 0.05 to 0.8 μm.

12. A semiconductor laser comprising:

an active layer made of a Group III-V compound semiconductor for forming a zinc blend structure, said semiconductor of said active layer being constituted by an ordered structure of Group III atoms along a <111> direction and said semiconductor having two lattice constants "a" and "2a";

a first cladding layer of an n-conductivity type arranged on a negative polarity side of said active layer, said first cladding layer being constituted by a Group III-V compound semiconductor which forms a zinc blend structure and is heterogeneous from that of said active layer;

a second cladding layer of a p-conductivity type arranged on a positive polarity side of said active layer, said second cladding layer being constituted by a Group III-V compound semiconductor which forms a zinc blend structure and is heterogeneous with that of said active layer, said semiconductor of said second cladding layer having Group III atoms arranged at random, and having the lattice constant "a"; and a substrate on which said active layer and said first and second cladding layers are formed, said substrate constituted by a Group III-V compound semiconductor for forming a zinc blend structure, and having a (100) plane, and a plane which is offset from the (100) plane in an <011> direction within a range of 15°, or a plane which is offset from the (100) plane in an <011> direction within a range of 15°;

whereby the band discontinuity at the interface of the active layer and the second cladding layer is larger than if the Group III atoms of the active layer were disordered and whereby leakage of electrons from said active layer to said second cladding layer is reduced.

13. A laser according to claim 12, wherein said substrate essentially consists of GaAs.

14. A laser according to claim 12, wherein each of said active layer and said first and second cladding layers essentially consists of a semiconductor represented by $In_{1-Y}(Ga_{1-X}Al_X)_YP$ ($0 \leq X \leq 1$, $0 \leq Y \leq 1$).

15. A laser according to claim 12, wherein a distance between said active layer and said second cladding layer is set to be 0 to 40 nm.

16. A laser according to claim 12, wherein said first and second cladding layers are formed by an MOCVD method using first and second materials containing the Group V and III elements, respectively, under such conditions that a ratio of the molar flow rate of the first material to the second material is not less than 200, and a carrier concentration of said second cladding layer is set to be not less than $7 \times 10^{17}$ cm$^{-3}$.

17. A laser according to claim 12, wherein a thickness of said second cladding layer is set to be 0.05 to 0.8 μm.

18. A semiconductor laser, comprising:

an active layer made of a Group III-V compound semiconductor forming a blend structure, said semiconductor of said active layer comprising a first region having atoms of at least two different group III elements which are disordered along a <111> direction and having a first lattice constant and a second region having atoms of at least two different group III elements ordered along a <111> direction and having a second lattice constant that is twice as large as the first lattice constant;

a first cladding layer of an n-conductivity type arranged on a negative polarity side of said active layer, said first cladding layer being constituted by a group III-V compound semiconductor which forms a zinc blend structure and is heterogeneous from that of said active layer; and a second cladding layer of a p-conductivity type arranged on a positive polarity side of said active layer, said second cladding layer being constituted by a group III-V compound semiconductor which forms a zinc blend structure and is heterogeneous with that of said active layer, said semiconductor of said second cladding layer having Group III atoms of at least two different group III elements randomly distributed among group III sub-lattice sites and having the lattice constant "a".

19. A laser according to claim 18, wherein the semiconductor in the second region comprises an ordered domain.

* * * * *